United States Patent
Seo et al.

(10) Patent No.: US 9,252,285 B2
(45) Date of Patent: Feb. 2, 2016

(54) DISPLAY SUBSTRATE INCLUDING A THIN FILM TRANSISTOR AND METHOD OF MANUFACTURING THE SAME

(71) Applicant: Samsung Display Co., Ltd., Yongin, Gyeonggi-Do (KR)

(72) Inventors: Ki-Seong Seo, Seoul (KR); Sung-Hoon Yang, Seoul (KR); Tae-Young Ahn, Suwon-si (KR); Sang-Wook Lee, Busan (KR); Jung-Yun Jo, Namyangju-si (KR); Heon-Sik Ha, Osan-si (KR); Jin-Ho Hwang, Osan-si (KR); Kyung-Tea Park, Seoul (KR); Jun-Mo Im, Seoul (KR)

(73) Assignee: SAMSUNG DISPLAY CO., LTD. (KR)

(*) Notice: Subject to any disclaimer, the term of this patent is extended or adjusted under 35 U.S.C. 154(b) by 0 days.

(21) Appl. No.: 14/249,525

(22) Filed: Apr. 10, 2014

(65) Prior Publication Data

US 2015/0021592 A1 Jan. 22, 2015

(30) Foreign Application Priority Data

Jul. 16, 2013 (KR) .................. 10-2013-0083670

(51) Int. Cl.
*H01L 21/26* (2006.01)
*H01L 29/786* (2006.01)
*H01L 29/66* (2006.01)

(52) U.S. Cl.
CPC ...... *H01L 29/7869* (2013.01); *H01L 29/66969* (2013.01)

(58) Field of Classification Search
CPC ............ H01L 21/3003; H01L 21/3105; H01L 21/76826; H01L 21/76856
USPC .......................................................... 438/513
See application file for complete search history.

(56) References Cited

U.S. PATENT DOCUMENTS

| 7,061,018 | B2 | 6/2006 | Tokuhiro et al. | |
| 2013/0171836 | A1* | 7/2013 | Liu et al. | 438/768 |
| 2013/0320328 | A1* | 12/2013 | Lee et al. | 257/43 |

FOREIGN PATENT DOCUMENTS

| JP | 2007-220819 A | 8/2007 |
| KR | 1020000003173 A | 1/2000 |
| KR | 1020030077372 A | 10/2003 |
| KR | 1020040022289 A | 3/2004 |
| KR | 1020070109736 A | 11/2007 |
| KR | 1020110061419 A | 6/2011 |

* cited by examiner

*Primary Examiner* — Daniel Whalen
(74) *Attorney, Agent, or Firm* — Cantor Colburn LLP

(57) ABSTRACT

A method of manufacturing a display substrate includes forming a gate electrode on a base substrate, forming an active pattern which includes an oxide semiconductor and overlaps with the gate electrode, forming an etch stopper which partially covers the active pattern, and performing a plasma treatment process to promote a reduction reaction to portions of the active pattern exposed by the etch stopper, thereby forming a source electrode and a drain electrode.

13 Claims, 14 Drawing Sheets

DISPLAY SUBSTRATE INCLUDING A THIN FILM TRANSISTOR AND METHOD OF MANUFACTURING THE SAME

This application claims priority to Korean Patent Application No. 10-2013-0083670, filed on Jul. 16, 2013, and all the benefits accruing therefrom under 35 U.S.C. §119, the contents of which application are herein incorporated by reference in their entirety.

BACKGROUND

1. Field

The invention relates to a display substrate including a thin film transistor and a method of manufacturing the display substrate.

2. Description of Related Technology

Generally, a thin film transistor ("TFT") for driving a pixel in a display device includes a gate electrode, a source electrode, a drain electrode and an active pattern forming a channel between the source electrode and the drain electrode. The active pattern includes a semiconductor layer including amorphous silicon, polycrystalline silicon, oxide semiconductor or the like.

Amorphous silicon has a relatively low electron mobility, which may be about 1 square centimeter per volt second ($cm^2/V \cdot s$) to about 10 $cm^2/V \cdot s$, so that a TFT including amorphous silicon has relatively low driving characteristics. In contrast, polycrystalline silicon has a relatively high electron mobility, which may be about 10 $cm^2/V \cdot s$ to about hundreds $cm^2/V \cdot s$. However, a crystallization process is required for forming polycrystalline silicon. Thus, forming a uniform polycrystalline silicon layer on a large-sized substrate may be difficult, and resulting manufacturing costs are high.

Oxide semiconductors may be formed through a low-temperature process, may be easily formed in a large-scale, and have a high electron mobility. Thus, research is actively being conducted on TFTs which include an oxide semiconductor.

SUMMARY

In a method of manufacturing a thin film transistor ("TFT"), patterning processes using masks are performed repeatedly. However, as a number of masks increases, manufacturing costs and time increase.

One or more exemplary embodiment provides a display substrate having improved reliability.

One or more exemplary embodiment provides a method of manufacturing a display substrate using reduced masks.

According to an exemplary embodiment, a method for manufacturing a display substrate is provided. In the method, a gate electrode is disposed on a base substrate. An active pattern is provided to include an oxide semiconductor. The active pattern overlaps with the gate electrode. An etch stopper is provided to partially cover the active pattern. A plasma treatment process is performed to promote a reduction reaction to portions of the active pattern exposed by the etch stopper, thereby forming a source electrode and a drain electrode.

In an exemplary embodiment, the source electrode and the drain electrode may be self-aligned not to overlap with the etch stopper.

In an exemplary embodiment, the plasma treatment process may be performed in an atmosphere including a hydrogen gas.

In an exemplary embodiment, forming the source electrode and the drain electrode may include reducing indium from the oxide semiconductor of the active pattern.

In an exemplary embodiment, the plasma treatment process may be performed in an atmosphere including a fluorine gas.

In an exemplary embodiment, forming the source electrode and the drain electrode may include implanting fluorine at upper portions of the active pattern.

In an exemplary embodiment, forming the active pattern may include forming an oxide semiconductor layer overlapping with the gate electrode, forming a first photoresist pattern on the oxide semiconductor layer and partially removing the oxide semiconductor layer using the first photoresist pattern as an etching mask.

In an exemplary embodiment, the first photoresist pattern may include a first thickness portion and a second thickness portion, and the second thickness portion may be thinner than the first thickness portion.

In an exemplary embodiment, forming the first photoresist pattern may include using a slit mask.

In an exemplary embodiment, forming the first photoresist pattern may include using a half-tone mask.

In an exemplary embodiment, forming the etch stopper may include forming an etch stopper layer on the oxide semiconductor layer before forming the first photoresist pattern, exposing the first photoresist pattern from a back side of the base substrate using the gate electrode as an exposure mask, partially removing the first photoresist pattern to provide a remaining photoresist pattern and partially removing the etch stopper layer using the remaining photoresist pattern as an etching mask.

In an exemplary embodiment, forming the active pattern may include forming a first active pattern including a first oxide semiconductor, the first active pattern overlapping with the gate electrode and forming a second active pattern including a second oxide semiconductor on the first active pattern.

In an exemplary embodiment, the second oxide semiconductor may include indium content higher than that of the first oxide semiconductor.

In an exemplary embodiment, forming the source electrode and the drain electrode may include performing the plasma treatment process to promote the reduction reaction to portions of the second active pattern.

According to an exemplary embodiment, a display substrate is provided. The display substrate includes a gate electrode, an active pattern, an etch stopper, a source electrode and a drain electrode. The gate electrode is disposed on a base substrate. The active pattern includes an oxide semiconductor. The active pattern overlaps with the gate electrode. The etch stopper is disposed on the active pattern. The source electrode at an upper portion of the active pattern includes a top surface that is substantially coplanar to a top surface of the active pattern. The drain electrode at the upper portion of the active pattern includes a top surface that is substantially coplanar to the top surface of the active pattern. The drain electrode is spaced apart from the source electrode.

In an exemplary embodiment, the source electrode and the drain electrode may be exposed by the etch stopper.

In an exemplary embodiment, the source electrode and the drain electrode may include indium provided by a reduction reaction to the oxide semiconductor of the active pattern.

In an exemplary embodiment, the source electrode and the drain electrode may include oxygen content lower than that of the oxide semiconductor In an exemplary embodiment, the gate electrode may be disposed between the active pattern and the base substrate In an exemplary embodiment, the source electrode and the drain electrode may include bottom surfaces that are substantially coplanar to a bottom surface of the active pattern.

According to an exemplary embodiment, a source electrode and a drain electrode may be provided without performing an additional patterning process using an additional exposure mask. The source electrode and the drain electrode may be self-aligned not to overlap with the gate electrode. Therefore, a misalignment between the channel region and the source and drain electrodes may be effectively prevented or reduced.

BRIEF DESCRIPTION OF THE DRAWINGS

The above and other features and advantages will become more apparent by describing exemplary embodiments thereof with reference to the accompanying drawings, in which.

DETAILED DESCRIPTION

Figure 1:
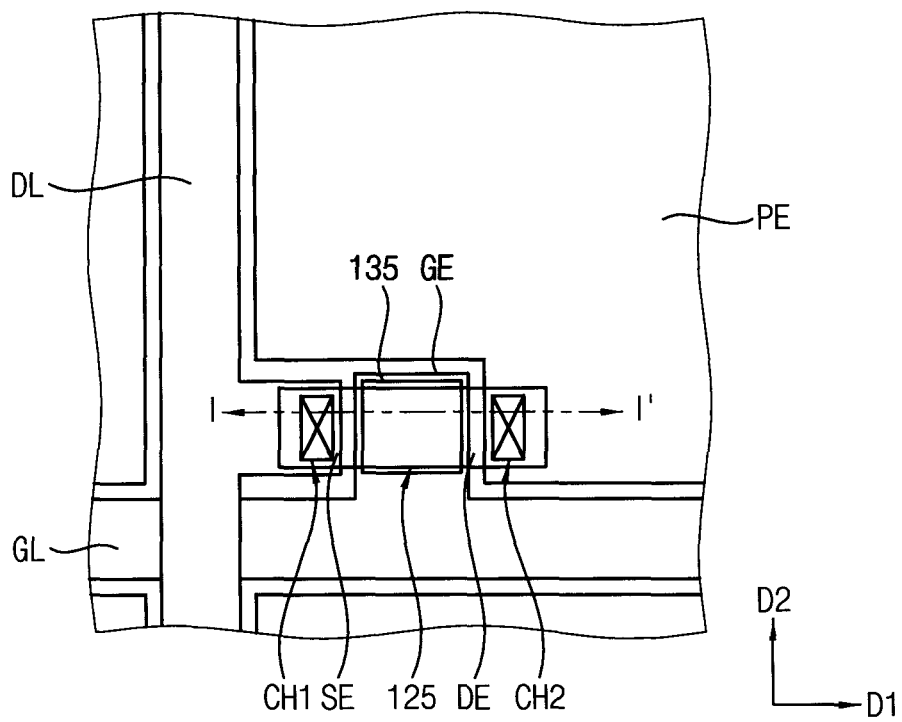
FIG. 1 is a plan view illustrating a display substrate according to exemplary embodiments of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiment of the invention will be explained in detail with reference to the accompanying drawings.

Figure 2:
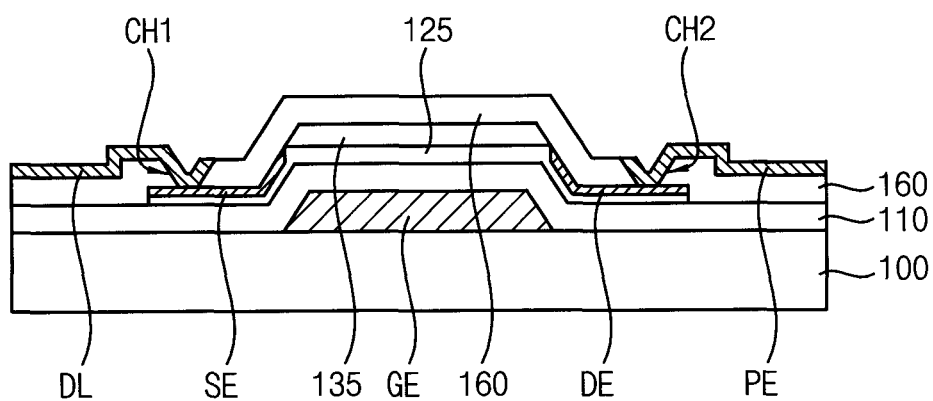
FIG. 2 is a cross-sectional view taken along line I-I' of FIG. 1 according to exemplary embodiments of the invention.

FIG. 1 is a plan view illustrating a display substrate according to exemplary embodiments of the invention, and FIG. 2 is a cross-sectional view taken along line I-I' of FIG. 1 according to exemplary embodiments of the invention.

Referring to FIGS. 1 and 2, the display substrate according to an exemplary embodiment of the invention includes a base substrate 100, a gate line GL, a data line DL, a thin film transistor ("TFT"), a passivation layer 160, a pixel electrode PE and the like. The TFT includes a gate electrode GE, a gate insulation layer 110, an active pattern 125, an etch stopper 135, a source electrode SE and a drain electrode DE.

The gate line GL extends in a first direction D1, and the data line DL extends in a second direction D2 in a plan view. The first direction D1 crosses the second direction D2. In one exemplary embodiment, the first direction D1 may be substantially perpendicular to the second direction D2.

The gate line GL is electrically connected to the gate electrode GE. In an exemplary embodiment, the gate electrode GE may protrude from the gate line GL in the second direction D2, for example.

The gate insulation layer 110 is disposed on the base substrate 100 to cover the gate line GL and the gate electrode GE. In an exemplary embodiment, the gate insulation layer 110 may include an insulation material such as silicon oxide (SiOx) or silicon nitride (SiNx), for example. In an exemplary embodiment, the gate insulation layer 110 may include silicon oxide, e.g., boro-phospho-silicate glass ("BPSG"), tonen silazene ("TOSZ"), undoped silicate glass ("USG"), spin on glass ("SOG"), flowable oxide ("FOX®"), tetra-ethyl-orthosilicate ("TEOS") or high density plasma chemical vapor deposition ("HDP-CVD"), for example. Alternatively, the gate insulation layer 110 may include a multi-layered structure including silicon oxide and silicon nitride.

The active pattern 125 on the gate insulation layer 110 overlaps with the gate electrode GE. The active pattern 125 includes a metal oxide semiconductor. That is, the active pattern 125 may include oxide of indium (In), zinc (Zn), gallium (Ga), tin (Sn) or hafnium (Hf), for example. In an exemplary embodiment, the active pattern 125 may include indium-zinc-tin oxide ("IZTO"), indium-gallium-zinc oxide ("IGZO") or hafnium-indium-zinc oxide ("HIZO"), for example.

In one exemplary embodiment, the TFT may have a bottom gate structure in which the gate electrode GE may be disposed between the base substrate 100 and the active pattern 125.

The etch stopper 135 is disposed on the active pattern 125. In an exemplary embodiment, the etch stopper 135 may include an insulation material such as silicon oxide, for example. The etch stopper 135 overlaps with the gate electrode GE. The etch stopper 135 may protect the active pattern 125 during the process for manufacturing the display substrate.

The source electrode SE and the drain electrode DE are spaced apart from each other, and are disposed at an upper portion of the active pattern 125. The source electrode SE and the drain electrode DE have electrical resistance lower than that of the metal oxide semiconductor of the active pattern 125.

In one exemplary embodiment, the source electrode SE and the drain electrode DE may include a conductive material including indium content higher than that of the metal oxide semiconductor of the active pattern 125. Particularly, the source electrode SE and the drain electrode DE may include excess indium provided by a hydrogen plasma treatment.

In other exemplary embodiments, the source electrode SE and the drain electrode DE may include a conductive material including fluorine content higher than that of the metal oxide semiconductor of the active pattern 125. Therefore, the conductive material of the source electrode SE and the drain electrode DE may have an electron density higher than that of the metal oxide semiconductor of the active pattern 125. That is, the source electrode SE and the drain electrode DE may include a conductive material provided by a halogen (particularly, fluorine) plasma treatment.

In other exemplary embodiments, the source electrode SE and the drain electrode DE may include a conductive material including oxygen content lower than that of the metal oxide semiconductor of the active pattern 125. That is, the source electrode SE and the drain electrode DE may include a conductive material provided by a plasma treatment using an inert gas (particularly, argon gas).

The source electrode SE and the drain electrode DE are disposed at upper portions of the active pattern 125. That is, the source electrode SE and the drain electrode DE may be provided (e.g., formed) by a reduction reaction of the upper portions of the active pattern 125 exposed by the etch stopper 135. Therefore, top surfaces of the source electrode SE and the drain electrode DE may be coplanar to a top surface of the active pattern 125. In one exemplary embodiment, bottom surfaces of the source electrode SE and the drain electrode DE may be higher than a bottom surface of the active pattern 125.

The source electrode SE and the drain electrode DE are provided by the reduction reaction, while the etch stopper 135 is disposed on the active pattern 125. Therefore, the source electrode SE and the drain electrode DE are disposed not to overlap with the etch stopper 135. That is, the source electrode SE and the drain electrode DE are self-aligned not to overlap with the etch stopper 135.

A portion of the active pattern 125 between the source electrode SE and the drain electrode DE serves as a channel region of the TFT. That is, the channel region of the active pattern 125 may overlap with the etch stopper 135.

The passivation layer 160 covers the TFT. The passivation layer 160 includes an insulation material. In an exemplary embodiment, the passivation layer 160 may include silicon oxide or silicon nitride, for example.

The data line DL is disposed on the passivation layer 160, and is electrically connected to the source electrode SE through a first contact hole CH1 penetrating the passivation layer 160. The data line DL includes a transparent conductive material. In an exemplary embodiment, the data line DL may include indium zinc oxide ("IZO"), indium tin oxide ("ITO"), tin oxide or zinc oxide, for example.

Further, the pixel electrode PE is disposed on the passivation layer 160, and is electrically connected to the drain electrode DE through a second contact hole CH2 penetrating the passivation layer 160. In an exemplary embodiment, the pixel electrode PE may include a material substantially the same as or similar to that of the data line DL, for example.

According to exemplary embodiments, the TFT of the display substrate includes the gate electrode GE, the gate insulation layer 110, the active pattern 125, the etch stopper 135, the source electrode SE and the drain electrode DE. The source electrode SE and the drain electrode DE may be provided by a reduction reaction to the upper portions of the active pattern 125. Therefore, the source electrode SE and the drain electrode DE may be self-aligned not to overlap with the gate electrode GE.

Figure 3:
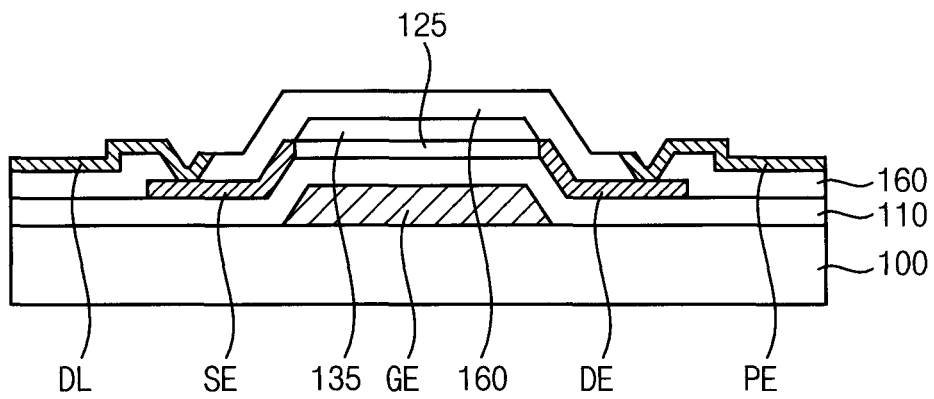
FIG. 3 is a cross-sectional view taken along line I-I' of FIG. 1 according to other exemplary embodiments of the invention.

FIG. 3 is a cross-sectional view taken along line I-I' of FIG. 1 according to other exemplary embodiments of the invention. The display substrate of FIG. 3 may be substantially similar to those illustrated in FIG. 2 except for the source electrode SE and the drain electrode DE.

Referring to FIG. 3, the display substrate according to an exemplary embodiment of the invention includes a base substrate 100, a gate line GL, a data line DL, a TFT, a passivation layer 160, a pixel electrode PE and the like. The TFT includes a gate electrode GE, a gate insulation layer 110, an active pattern 125, an etch stopper 135, a source electrode SE and a drain electrode DE.

The source electrode SE and the drain electrode DE are spaced apart from each other, and contact the active pattern 125. Particularly, the source electrode SE and the drain electrode DE are disposed at sides of the active pattern 125.

In one exemplary embodiment, the source electrode SE and the drain electrode DE may be provided by a reduction reaction to whole portions of the active pattern 125 exposed by the etch stopper 135. Therefore, bottom surfaces of the source electrode SE and the drain electrode DE may be coplanar to a bottom surface of the active pattern 125. The source electrode SE and the drain electrode DE are disposed not to overlap with the etch stopper 135 and the gate electrode GE.

A portion of the active pattern 125 between the source electrode SE and the drain electrode DE serves as a channel region of the TFT.

According to exemplary embodiments, the TFT of the display substrate may include the gate electrode GE, the gate insulation layer 110, the active pattern 125, the etch stopper 135, the source electrode SE and the drain electrode DE. The source electrode SE and the drain electrode DE may be provided by a plasma reduction process to the active pattern 125. Therefore, the source electrode SE and the drain electrode DE are self-aligned not to overlap with the gate electrode GE.

FIGS. 4 to 12 are cross-sectional views illustrating a method of manufacturing the display substrate illustrated in FIGS. 1 and 2.

Figure 4:
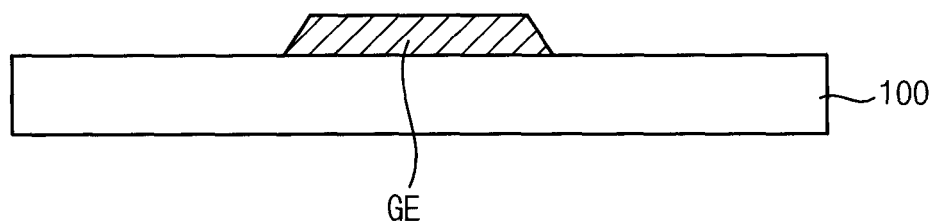
FIGS. 4 to 12 are cross-sectional views illustrating a method of manufacturing the display substrate illustrated in FIGS. 1 and 2.

Referring to FIG. 4, a gate line and a gate electrode GE are disposed on a base substrate 100. Particularly, a gate metal layer is disposed on the base substrate 100, and then the gate metal layer is patterned to provide the gate line and the gate electrode GE. Exemplary embodiments of the base substrate 100 may include a glass substrate, a quartz substrate, a silicon substrate, a plastic substrate and the like.

Exemplary embodiments of a material that may be used for the gate metal layer may include copper, silver, chromium, molybdenum, aluminum, titanium, manganese, alloy thereof and the like. The gate metal layer may have a single-layered structure, or a multi-layered structure including a plurality of metal layers including different metals.

Figure 5:
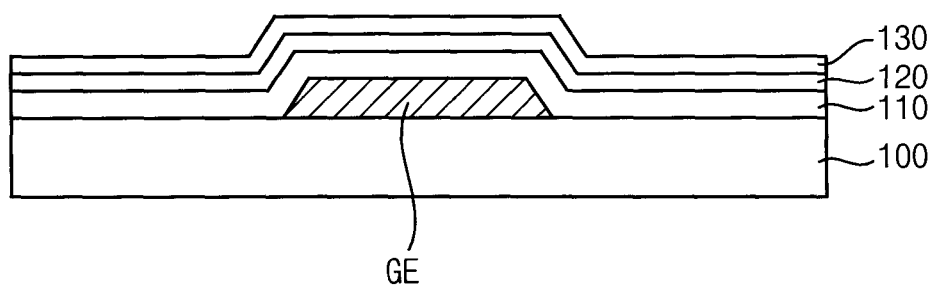

Referring to FIG. 5, a gate insulation layer 110, an oxide semiconductor layer 120 and an etch stopper layer 130 are sequentially disposed on the base substrate 100 to cover the gate line and the gate electrode GE.

The gate insulation layer 110 may be provided by a chemical vapor deposition ("CVD") process or an atomic layer deposition ("ALD") process. In an exemplary embodiment, the gate insulation layer 110 may be provided using silicon oxide, e.g., BPSG, TOSZ, USG, SOG, FOX®, TEOS or HDP-CVD, for example. Alternatively, the gate insulation layer 110 may be a multi-layered structure including silicon oxide and silicon nitride.

The oxide semiconductor layer 120 may be provided through conventional methods for providing an oxide semiconductor layer. In one exemplary embodiment, the oxide semiconductor layer 120 may be provided through a physical vapor deposition ("PVD") process such as a vacuum deposition process or a sputtering process.

Particularly, the oxide semiconductor layer 120 may be provided using a sputtering target including a material substantially the same as that of the oxide semiconductor layer 120. In an exemplary embodiment, the oxide semiconductor layer 120 may be provided using a sputtering target including IGZO, for example.

An annealing process may be further performed to heat the oxide semiconductor layer 120. In one exemplary embodiment, the annealing process may be performed at about 230 degrees Celsius (° C.) to about 400° C. The annealing process may improve electrical characteristics of the oxide semiconductor layer 120.

Then, the etch stopper layer 130 is disposed on the oxide semiconductor layer 120. The etch stopper layer 130 may be provided using an inorganic insulation material. In an exemplary embodiment, the etch stopper layer 130 may be provided using silicon oxide, for example.

In one exemplary embodiment, the gate insulation layer 110, the oxide semiconductor layer 120 and the etch stopper layer 130 may be provided to have uniform thicknesses. That is, the gate insulation layer 110, the oxide semiconductor layer 120 and the etch stopper layer 130 may be conformably disposed on a top surface of the base substrate 100, a top surface of the gate electrode GE and a sidewall of the gate electrode GE.

Figure 6:
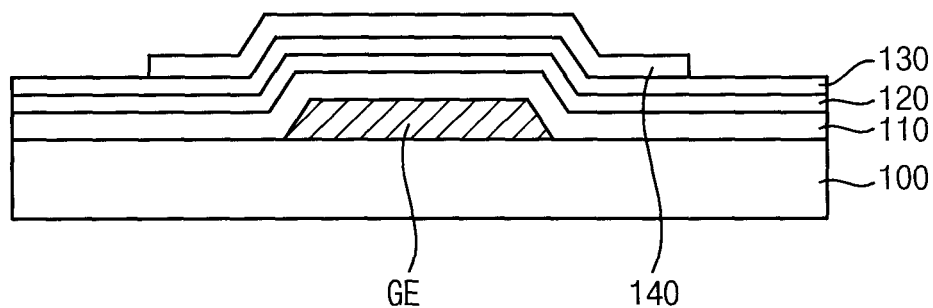

Referring to FIG. 6, a first photoresist pattern 140 is disposed on the etch stopper layer 130.

Particularly, a first photoresist layer is disposed on the etch stopper layer 130, and then the first photoresist layer is patterned by an exposure process and a develop process using a mask, thereby providing the first photoresist pattern 140.

The first photoresist pattern 140 may be provided to overlap with the gate electrode GE. Particularly, the first photoresist pattern 140 may be provided to correspond to an active pattern 125. (See FIG. 7)

Figure 7:
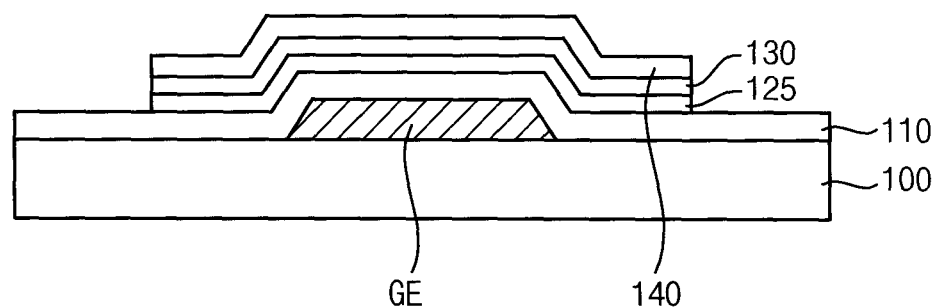

Referring to FIGS. 6 and 7, the oxide semiconductor layer 120 and the etch stopper layer 130 are partially removed.

The oxide semiconductor layer 120 and the etch stopper layer 130 are partially removed by an etching process using the first photoresist pattern 140 as an etching mask. Therefore, a remaining oxide semiconductor layer 120 under the first photoresist pattern 140 is referred to as an active pattern 125.

In one exemplary embodiment, the oxide semiconductor layer 120 and the etch stopper layer 130 may have different etch rates to a specific etching solution, so that the oxide semiconductor layer 120 and the etch stopper layer 130 may be etched by different etch processes using different etching solutions. In an exemplary embodiment, the etch stopper layer 130 may be etched by a dry etching process, and the oxide semiconductor layer 120 may be etched by a wet etching process, for example.

Then, the first photoresist pattern 140 is removed by an ashing process or a strip process.

Figure 8:
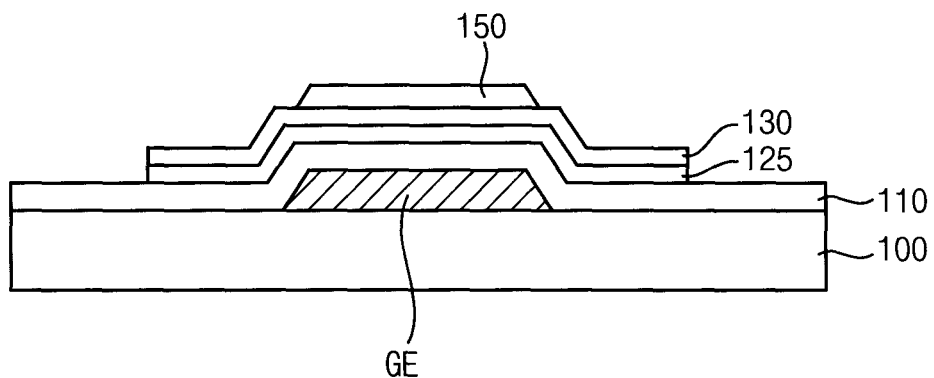

Referring to FIG. 8, a second photoresist pattern 150 is disposed on the etch stopper layer 130.

Particularly, a second photoresist layer is disposed on the gate insulation layer 110 and the etch stopper layer 130, and then the second photoresist layer is patterned by an exposure process and a develop process using a mask, thereby forming the second photoresist pattern 150.

The second photoresist pattern 150 is provided to overlap with the gate electrode GE. Particularly, the second photoresist pattern 150 may be provided to correspond to an etch stopper 135 (See FIG. 9).

Figure 9:
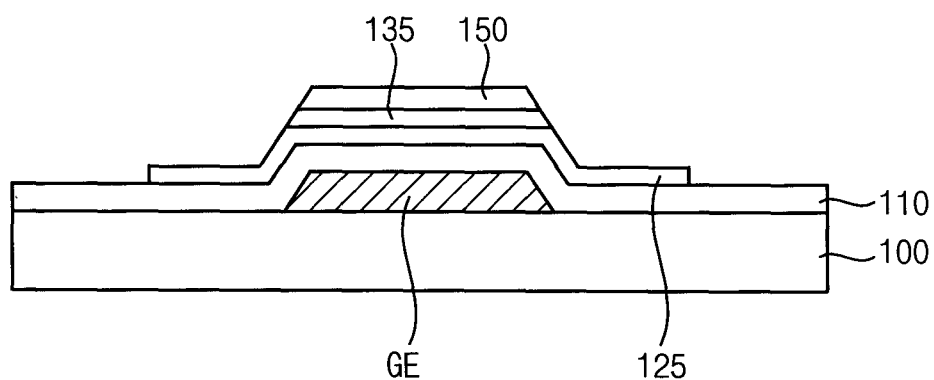

Referring to FIG. 9, the etch stopper layer 130 is partially removed.

The etch stopper layer 130 is partially removed by an etching process using the second photoresist pattern 150 as an etching mask. Therefore, a remaining etch stopper layer 130 under the second photoresist pattern 150 is referred to as an etch stopper 135. The etch stopper 135 may be provided to overlap with the gate electrode GE.

In one exemplary embodiments, the etch stopper layer 130 may be etched by a dry etching process. Then, the second photoresist pattern 150 may be removed by an ashing process or a strip process.

Figure 10:
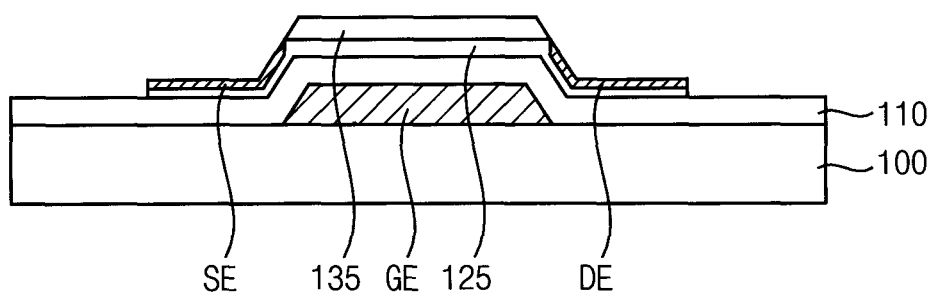

Referring to FIG. 10, a source electrode SE and a drain electrode DE are provided by a plasma reduction process to the active pattern 125.

Particularly, a plasma treatment process is performed to the active pattern 125, while the etch stopper 135 is disposed on the active pattern 125. Therefore, a reduction reaction occurs at upper portions of the active pattern 125.

In one exemplary embodiment, the plasma treatment process may be performed at an atmosphere including a hydrogen gas. Therefore, hydrogen plasma may promote a reduction reaction to the oxide semiconductor of the active pattern 125. That is, indium may be reduced at upper portions of the active pattern 125 thereby providing the source electrode SE and the drain electrode DE. The source electrode SE and the drain electrode DE may include a conductive material including indium content higher than that of the metal oxide semiconductor of the active pattern 125.

In other exemplary embodiments, the plasma treatment process may be performed at an atmosphere including a halogen gas, e.g., a fluorine gas, a chlorine gas, a bromine gas and an iodine gas. Particularly, the plasma treatment process may be performed using the fluorine gas. Therefore, fluorine plasma may promote a reduction reaction to the oxide semiconductor of the active pattern 125. The fluorine atoms or molecules may be implanted into the upper portions of the active pattern 125 thereby forming the source electrode SE and the drain electrode DE. The conductive material of the source electrode SE and the drain electrode DE may have an electron density higher than that of the metal oxide semiconductor of the active pattern 125.

In other exemplary embodiments, the plasma treatment process may be performed at an atmosphere including an inert gas, e.g., an argon gas, a neon gas and a helium gas. Particularly, the plasma treatment process may be performed using the argon gas. Therefore, the argon plasma may promote a reduction reaction to the oxide semiconductor of the active pattern 125. That is, oxygen atoms may be removed at the upper portions of the active pattern 125, thereby forming the source electrode SE and the drain electrode DE. The source electrode SE and the drain electrode DE may include a conductive material including oxygen content lower than that of the metal oxide semiconductor of the active pattern 125.

A portion of the active pattern 125 covered by the etch stopper 135 does not react with the plasma. Therefore, the source electrode SE and the drain electrode DE may be self-aligned not to overlap with the etch stopper 135. The portion of the active pattern 125 may serve as a channel region of the TFT. Therefore, a misalignment between the channel region and the source and drain electrodes SE and DE may be effectively prevented or reduced.

According to exemplary embodiments, the source electrode SE and the drain electrode DE may be provided without performing an additional patterning process using a mask. Therefore, the processes may be simplified, and costs of the processes may be saved.

Figure 11:
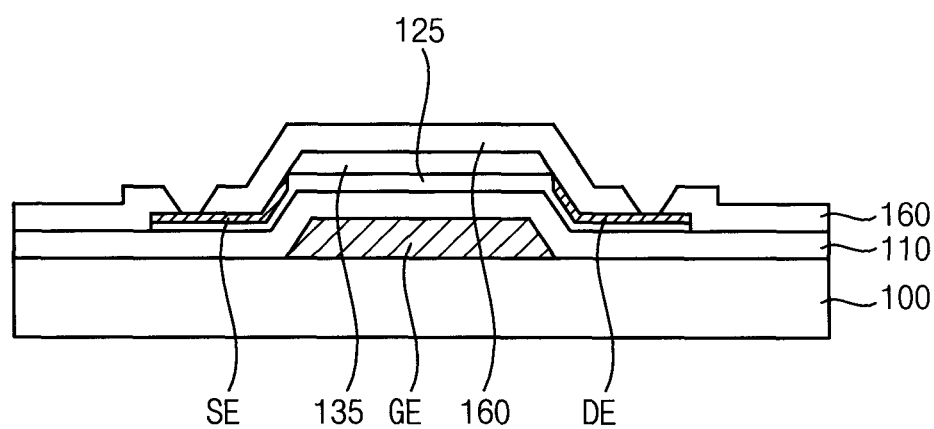

Referring to FIG. 11, a passivation layer 160 is provided to cover the source electrode SE, the drain electrode DE and the etch stopper 135, and then contact holes are defined through the passivation layer 160.

The passivation layer 160 is provided using an inorganic insulation material. In one exemplary embodiment, the passivation layer 160 may have a single-layered structure including silicon oxide. In other exemplary embodiments, the passivation layer 160 may have a multi-layered structure including silicon oxide and silicon nitride.

Then, the passivation layer 160 is partially removed to define the contact holes. The contact holes expose the source electrode SE and the drain electrode DE, respectively.

Figure 12:
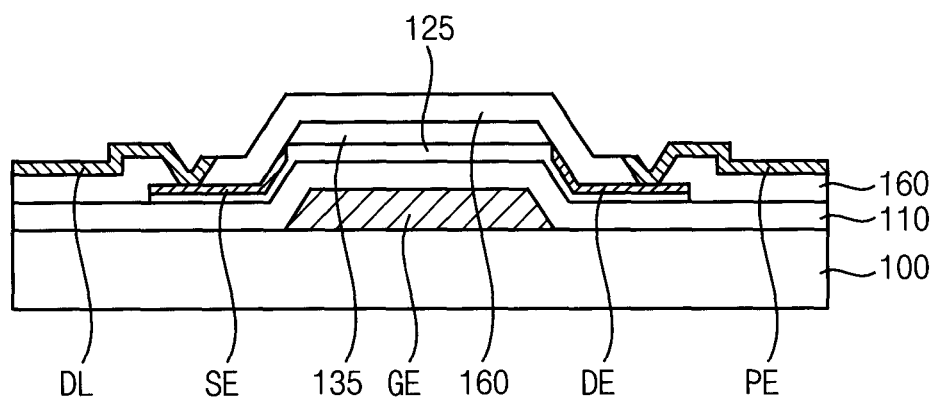

Referring to FIG. 12, a data line DL and a pixel electrode PE are provided to be electrically connected to the source electrode SE and the drain electrode DE, respectively.

A transparent conductive layer may be disposed on the passivation layer 160 to fill the contact holes, and the transparent conductive layer may be patterned to provide the data line DL and the pixel electrode PE. The transparent conductive layer may include IZO, ITO, tin oxide or zinc oxide. In one exemplary embodiment, the data line DL may directly contact the source electrode SE, and the drain electrode DE may directly contact the drain electrode DE.

In the exemplary embodiment illustrated in FIGS. 4 to 12, the process for forming the etch stopper 135 and the process for forming the active pattern 125 are performed using different masks. In another exemplary embodiment, the process for forming the etch stopper 135 and the process for forming the active pattern 125 may be simplified. Hereinafter, a method of manufacturing a display substrate will be explained in which the process for forming the etch stopper 135 and the process for forming the active pattern 125 are performed using the same mask.

FIGS. 13 to 19 are cross-sectional views illustrating a method of manufacturing the display substrate according to exemplary embodiments of the invention.

Figure 13:
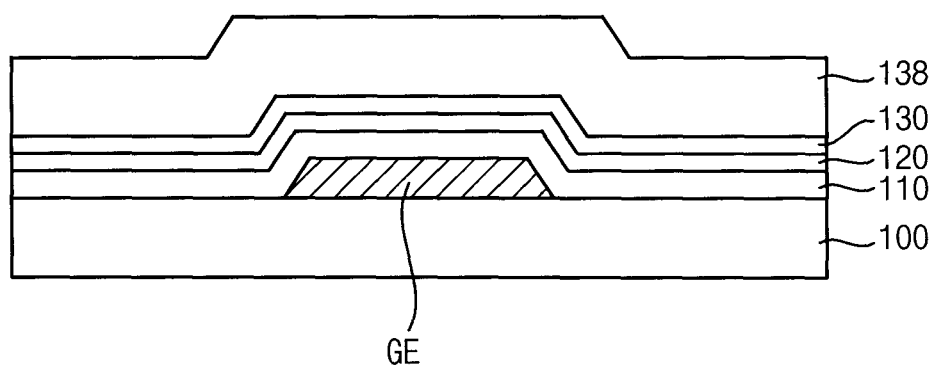
FIGS. 13 to 19 are cross-sectional views illustrating a method of manufacturing the display substrate according to exemplary embodiments of the invention.

Referring to FIG. 13, a gate line and a gate electrode GE are disposed on a base substrate 100, and then a gate insulation layer 110, an oxide semiconductor layer 120 and an etch stopper layer 130 are sequentially disposed on the base substrate 100 to cover the gate line and the gate electrode GE. A first photoresist layer 138 is disposed on the etch stopper layer 130.

Processes for forming the gate electrode GE, the gate insulation layer 110, the oxide semiconductor layer 120 and the etch stopper layer 130 may be substantially the same as those illustrated in FIGS. 4 and 5. Then, a spin coating process or a CVD process, for example, is performed to provide the first photoresist layer 138.

Figure 14:
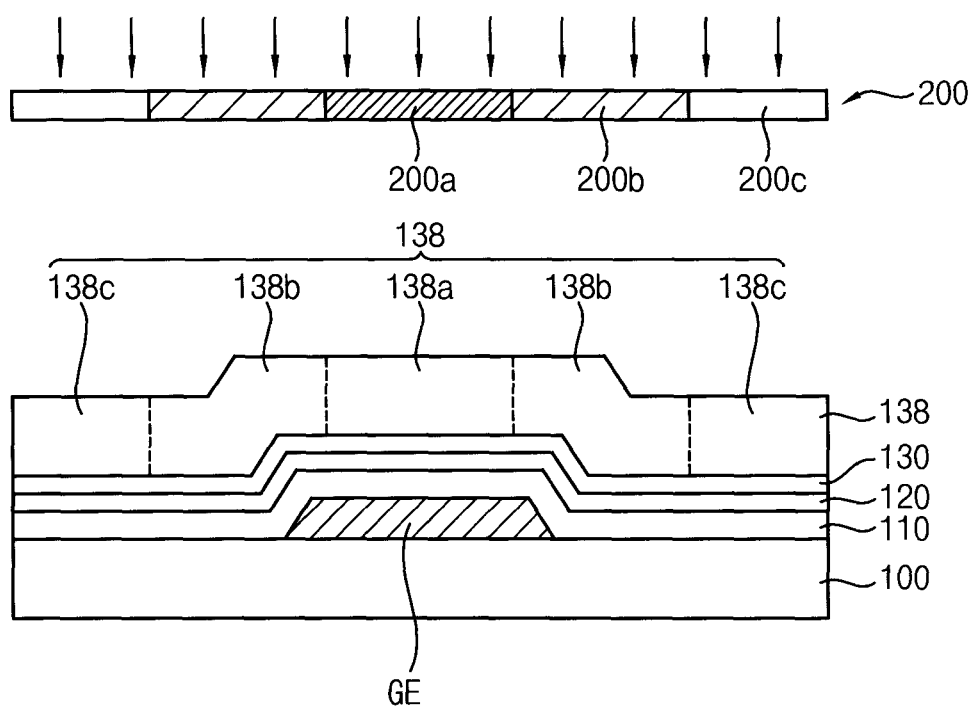

Referring to FIG. 14, the first photoresist layer 138 is selectively exposed using a half-tone mask 200.

The half-tone mask 200 is divided into an opaque region 200a, a semi-transparent region 200b and a transparent region 200c depending on a light transmittance. The opaque region 200a may block a light having a predetermined wave length, and the transparent region 200c may pass the light. The semi-transparent region 200b may have a light transmittance that is substantially lower than that of transparent region 200c, and is substantially higher than that of the opaque region 200a.

After aligning the half-tone mask 200, the first photoresist layer 138 is exposed using a light source. The first photoresist layer 138 may be selectively exposed and may be selectively harden by the exposure process. Therefore, the first photoresist layer 138 may be divided into a first exposure portion 138a, a second exposure portion 138b and a third exposure portion 138c.

Figure 15:
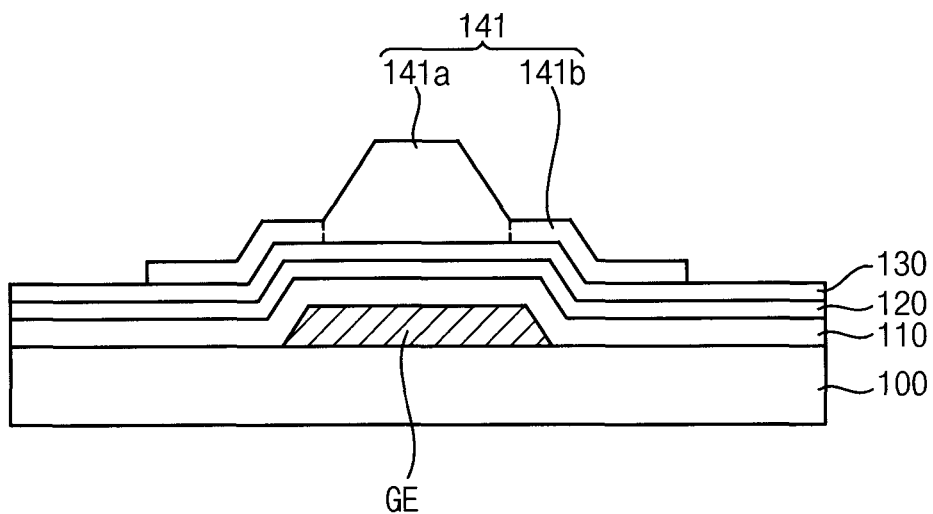

Referring to FIGS. 14 and 15, a develop process is performed to the first photoresist layer 138, thereby providing a first photoresist pattern 141.

In the develop process, the first exposure portion 138a, the second exposure portion 138b and the third exposure portion 138c have different solubility. That is, the first exposure portion 138a may have a relatively small solubility to a developing solution, and the third exposure portion 138c fully exposed to the light source may have a relatively large solubility to the developing solution. Further, the second exposure portion 138b partially exposed to the light source may have a solubility between those of the first exposure portion 138a and the third exposure portion 138c.

The first photoresist pattern 141 is provided by the develop process. That is, the first photoresist pattern 141 has a first thickness portion 141a and a second thickness portion 141b that is thinner than the first thickness portion 141a. In this case, the second thickness portion 141b may be disposed where a source electrode SE (See FIG. 19) and a drain electrode DE (See FIG. 19) will be provided, and the first thickness portion 141a may be disposed where an etch stopper 135 (See FIG. 18) will be provided.

Figure 16:
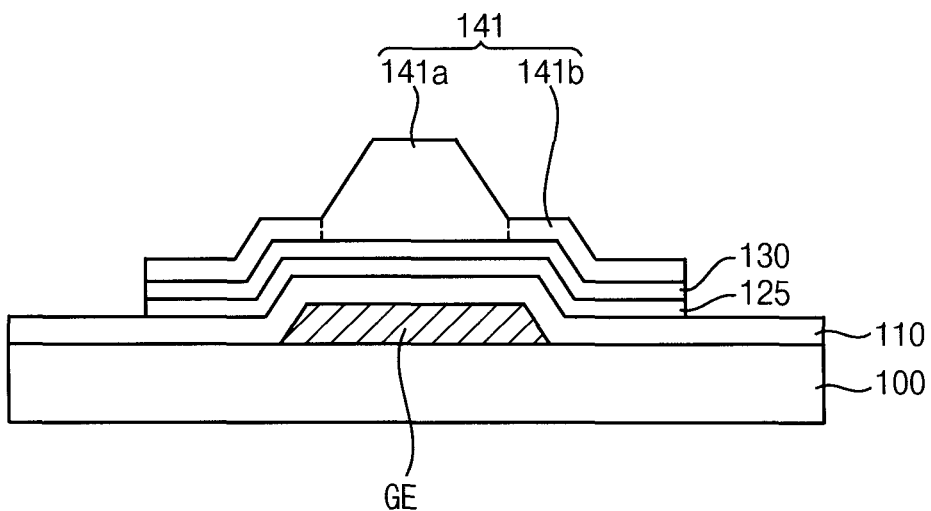

Referring to FIGS. 15 and 16, the etch stopper layer 130 and the oxide semiconductor layer 120 are partially removed using the first photoresist pattern 141 as an etching mask.

By the etching process, the oxide semiconductor layer 120 is partially removed to provide an active pattern 125. However, portions of the etch stopper layer 130 covered by the second thickness portion 141b may not be removed.

Figure 17:
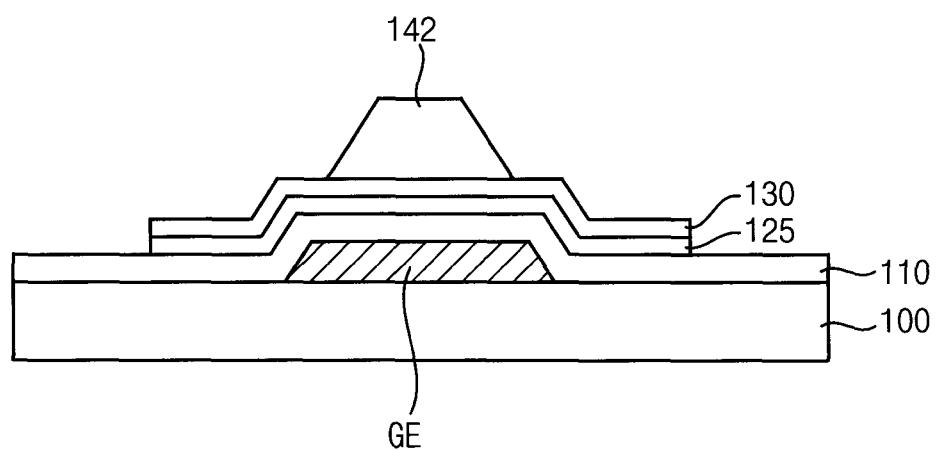

Referring to FIGS. 16 and 17, the first photoresist pattern 141 is partially removed to provide a remaining photoresist pattern 142.

In one exemplary embodiment, the first photoresist pattern 141 is partially removed by an etch back process. In this case, the second thickness portion 141b having a relatively small thickness may be entirely removed, and the first thickness portion 141a having a relatively large thickness may be partially removed to provide the remaining photoresist pattern 142.

Figure 18:
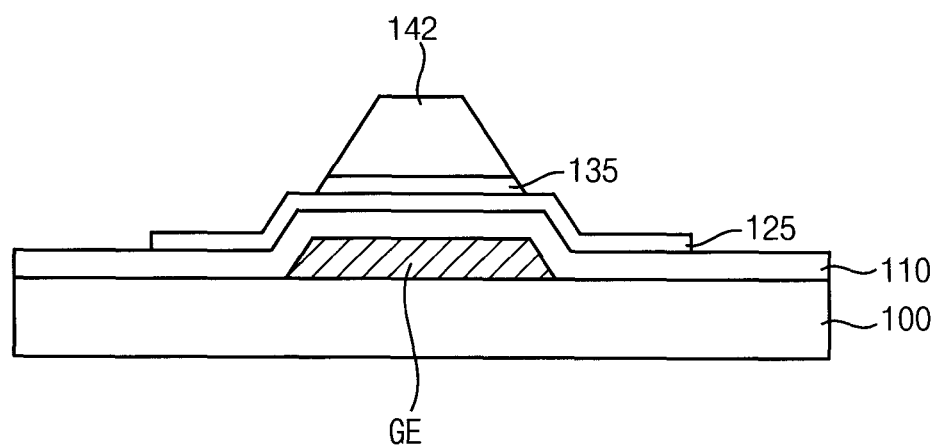

Referring to FIGS. 17 and 18, the etch stopper layer 130 is partially removed using the remaining photoresist pattern 142 as an etching mask, thereby forming an etch stopper 135.

The etching process may be adjusted not to remove the active pattern 125. Therefore, the active pattern 125 and the etch stopper 135 having different shapes may be provided using single exposure mask (that is, the half tone mask 200). Accordingly, process may be simplified.

Then, the remaining photoresist pattern 142 is removed by an ashing process or a strip process.

Figure 19:
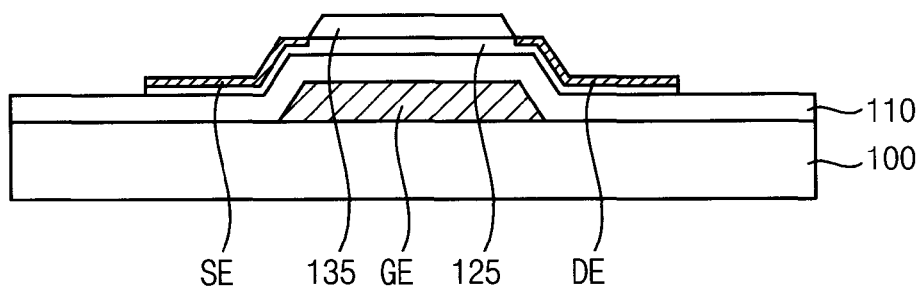

Referring to FIG. 19, a source electrode SE and a drain electrode DE are provided by a plasma reduction process to the active pattern 125.

Particularly, a plasma treatment process is performed to the active pattern 125, while the etch stopper 135 is disposed on the active pattern 125. Therefore, a reduction reaction occurs at upper portions of the active pattern 125. The plasma process may be substantially the same as or similar to those illustrate in FIG. 10.

A portion of the active pattern 125 covered by the etch stopper 135 does not react with the plasma. Therefore, the source electrode SE and the drain electrode DE may be self-aligned not to overlap with the etch stopper 135 and the gate electrode GE.

According to exemplary embodiments, the source electrode SE and the drain electrode DE may be provided without performing an additional patterning process using an additional exposure mask.

Then, a passivation layer, a pixel electrode and a data line may be provided by processes substantially the same as those illustrated in FIGS. 11 and 12.

In the exemplary embodiment illustrated in FIGS. 3 to 19, the etch stopper 135 and the active pattern 125 are provided using the half-tone mask 200. In another exemplary embodiment, the etch stopper 135 and the active pattern 125 may be provided using a different mask. Hereinafter, a method of manufacturing a display substrate will be explained in which the etch stopper 135 and the active pattern 125 are provided using a slit mask.

Figure 20:
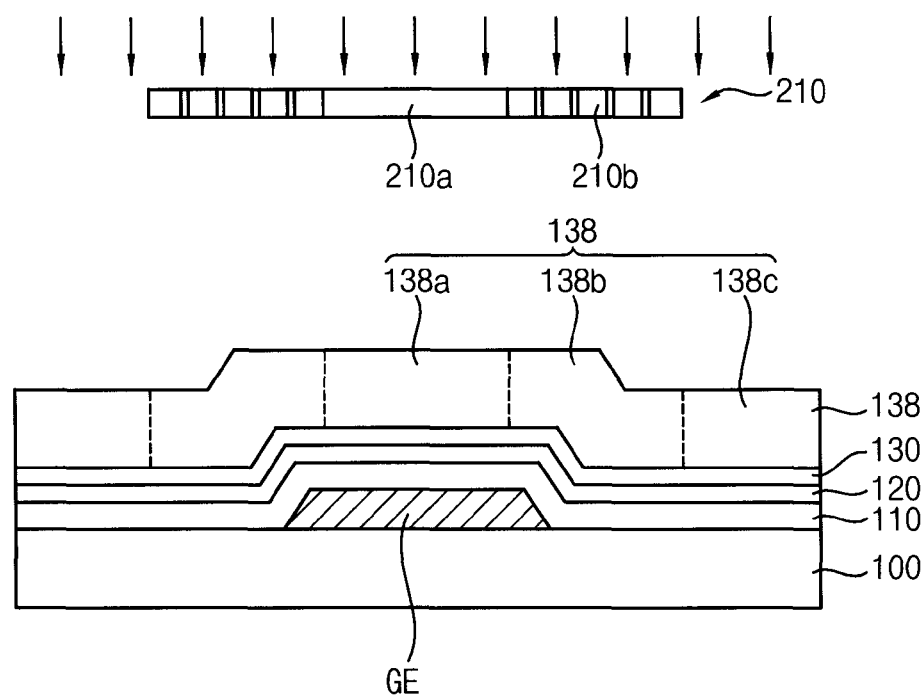
FIG. 20 is a cross-sectional view illustrating a method of manufacturing the display substrate according to exemplary embodiments of the invention.

FIG. 20 is a cross-sectional view illustrating a method of manufacturing the display substrate according to other exemplary embodiment of the invention.

Firstly, processes substantially the same as or similar to those illustrate in FIG. 13 are performed. That is, a gate line and a gate electrode GE are disposed on a base substrate 100, and then a gate insulation layer 110, an oxide semiconductor layer 120 and an etch stopper layer 130 are sequentially disposed on the base substrate to cover the gate line and the gate electrode GE. Further, a first photoresist layer 138 is disposed on the etch stopper layer 130.

Referring to FIG. 20, the first photoresist layer 138 is selectively exposed using the slit mask 210.

The slit mask 210 is divided into an opaque region 210a, a semi-transparent region 210b. The opaque region 210a may substantially block a light used in the exposure process, and a plurality of slits having fine gaps may be defined in the semi-transparent region 210b, so that the semi-transparent region 210b may have a predetermined transparency.

After aligning the slit mask 210, the first photoresist layer 138 is exposed using a light source. The first photoresist layer 138 may be divided into a first exposure portion 138a, a second exposure portion 138b and a third exposure portion 138c. In the develop process, the first exposure portion 138a, the second exposure portion 138b and the third exposure portion 138c have different solubility. Therefore, processes substantially the same as or similar to those illustrate in FIGS. 15 to 19 are performed to provide the display substrate.

According to exemplary embodiments, the active pattern 125 and the etch stopper 135 having different shapes may be provided using single exposure mask, e.g., the slit mask 210, for example.

In the exemplary embodiment illustrated in FIGS. 4 to 12, exposure processes are performed in one direction. In another exemplary embodiment, the exposure processes may be performed in two directions. Hereinafter, a method of manufacturing a display substrate will be explained in which the exposure processes are performed in a front direction and a back direction of a base substrate 100.

FIGS. 21 to 24 are cross-sectional views illustrating a method of manufacturing the display substrate according to exemplary embodiments of the invention.

Firstly, processes substantially the same as or similar to those illustrate in FIGS. 4 to 7 are performed. That is, a gate line and a gate electrode GE are disposed on the base substrate 100, and then a gate insulation layer 110, an oxide semiconductor layer 120 and an etch stopper layer 130 are sequentially disposed on the base substrate 100 to cover the gate line and the gate electrode GE.

Figure 21:
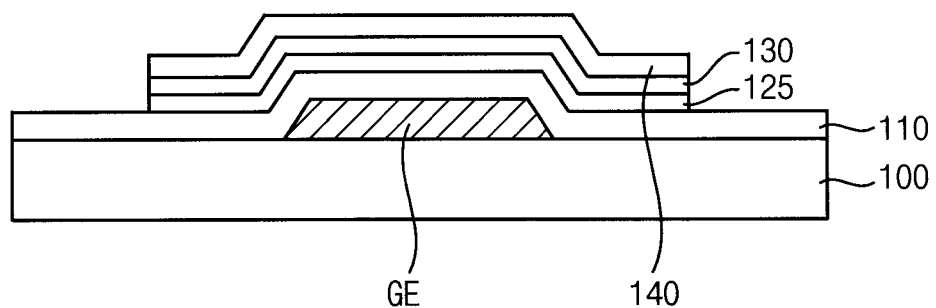
FIGS. 21 to 24 are cross-sectional views illustrating a method of manufacturing the display substrate according to other exemplary embodiment of the invention.

Referring to FIGS. 6 and 21, a first photoresist pattern 140 is disposed on the etch stopper layer 130, and then the oxide semiconductor layer 120 and the etch stopper layer 130 are partially removed using the first photoresist pattern 140 as an etching mask. By the etching process, the oxide semiconductor layer 120 is partially removed to provide an active pattern 125.

Figure 22:
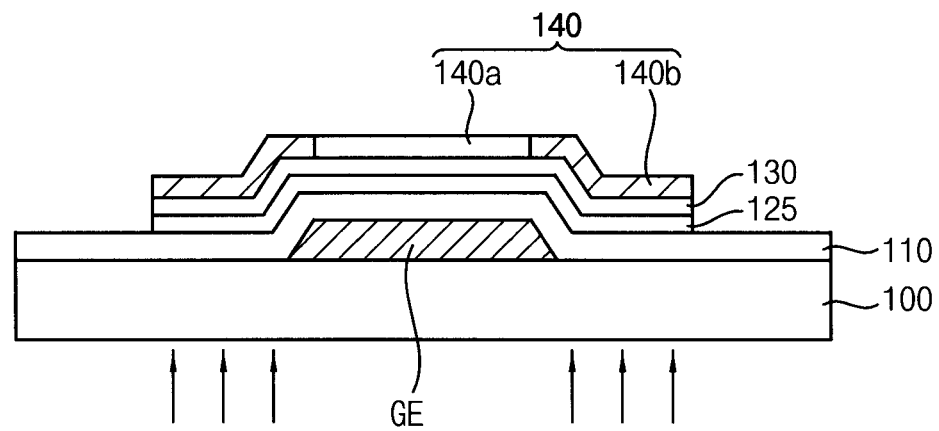

Referring to FIG. 22, an exposure process is performed to the first photoresist pattern 140 using a light source disposed at a back side of the base substrate 100.

That is, the light source may exposure the first photoresist pattern 140 from the back side of the base substrate 100. In this case, the gate electrode GE may serve as an exposure mask. Therefore, a first exposure portion 140a of the first photoresist pattern 140 disposed to overlap with the gate electrode GE may not be exposed to the light source, and a second exposure portion 140b of the first photoresist pattern 140 disposed not to overlap with the gate electrode GE may be exposed to the light source.

Figure 23:
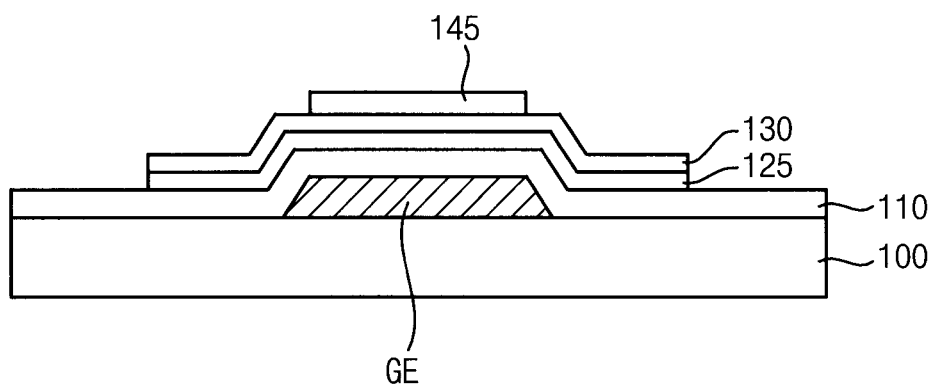

Referring to FIG. 23, a develop process is performed to the first photoresist pattern 140, thereby forming a remaining photoresist pattern 145.

In the develop process, the first exposure portion 140a and the second exposure portion 140b may have different solubility. That is, the second exposure portion 140b having a relatively large solubility may be entirely removed to provide the remaining photoresist pattern 145.

The first photoresist pattern 140 and the remaining photoresist pattern 145 may have different shapes. By performing an exposure process using the gate electrode GE, the remaining photoresist pattern 145 may be provided without using an additional exposure mask.

Figure 24:
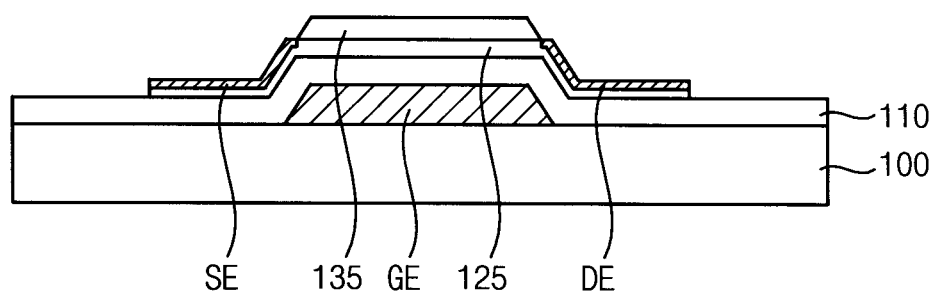

Referring to FIGS. 23 and 24, the etch stopper layer 130 may be partially removed using the remaining photoresist pattern 145 as an etching mask, thereby forming an etch stopper 135 and then a source electrode SE and a drain electrode DE are provided by a plasma reduction process to the active pattern 125.

Particularly, a plasma treatment process is performed to the active pattern 125, while the etch stopper 135 is disposed on the active pattern 125. Therefore, a reduction reaction occurs at upper portions of the active pattern 125. The plasma process may be substantially the same as or similar to those illustrate in FIG. 10.

According to exemplary embodiments, the source electrode SE and the drain electrode DE may be provided without performing an additional patterning process using an additional exposure mask.

Then, a passivation layer, a pixel electrode and a data line may be provided by processes substantially the same as those illustrated in FIGS. 11 and 12.

In the exemplary embodiment illustrated in FIGS. 4 to 12, the oxide semiconductor layer 120 has a single-layered structure. In another exemplary embodiment, the oxide semiconductor layer may have a multi-layered structure. Hereinafter, a method of manufacturing a display substrate will be explained in which the oxide semiconductor layer may include a first oxide semiconductor layer and a second oxide semiconductor layer.

Figure 25:
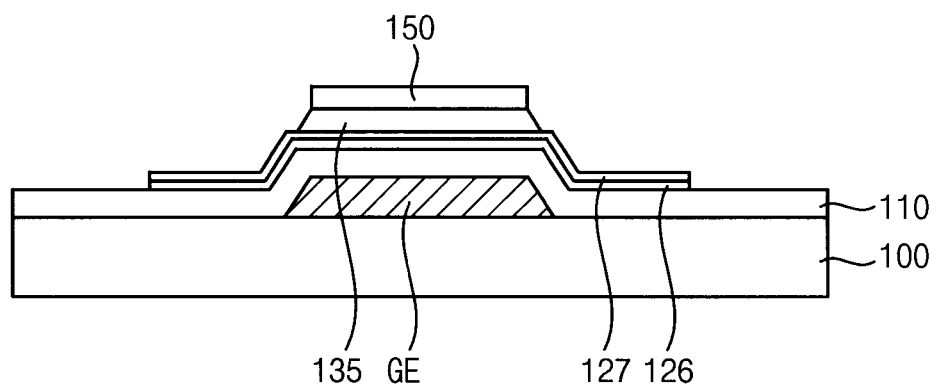
FIGS. 25 and 26 are cross-sectional views illustrating a method of manufacturing the display substrate according to an exemplary embodiment of the invention.
Figure 26:
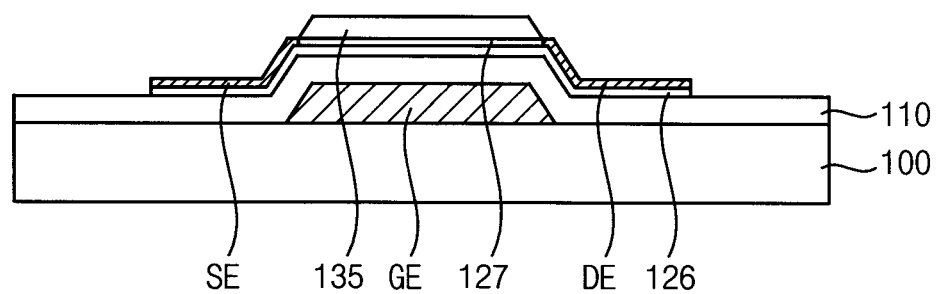

FIGS. 25 and 26 are cross-sectional views illustrating a method of manufacturing the display substrate according to exemplary embodiments of the invention.

Firstly, processes substantially the same as or similar to those illustrate in FIGS. 4 to 9 are performed. However, the oxide semiconductor is a multi-layered structure including a first oxide semiconductor layer and a second oxide semiconductor layer. Further, the active pattern is a multi-layered structure including a first active pattern 126 and a second active pattern 127 which may be stacked sequentially.

The first active pattern 126 and the second active pattern 127 include a first metal oxide semiconductor and a second metal oxide semiconductor, respectively. In an exemplary embodiment, the first active pattern 126 and the second active pattern 127 may include oxide of indium, zinc, gallium, tin or hafnium, for example. In an exemplary embodiment, the first active pattern 126 and the second active pattern 127 may include IZTO, IGZO or HIZO, for example.

The first active pattern 126 and the second active pattern 127 include different materials. In one exemplary embodiment, the second active pattern 127 may include the second oxide semiconductor that includes indium content higher than the first oxide semiconductor of the first active pattern 126. In other exemplary embodiments, the second active pattern 127 may include the second oxide semiconductor that includes oxygen content lower than the first oxide semiconductor of the first active pattern 126.

Referring to FIG. 26, a source electrode SE and a drain electrode DE are provided by a plasma reduction process to the second active pattern 127.

Particularly, a plasma treatment process is performed to the second active pattern 127, while the etch stopper 135 is disposed on the second active pattern 127. Therefore, a reduction reaction occurs at portions of the second active pattern 127. The plasma process may be substantially the same as or similar to those illustrate in FIG. 10.

The second active pattern 127 may include the second oxide semiconductor that includes indium content higher than the first oxide semiconductor of the first active pattern 126 or includes oxygen content lower than that of the first active pattern 126, so that the second active pattern 127 may be easily reduced to provide the source electrode SE and the drain electrode DE.

A portion of the second active pattern 127 covered by the etch stopper 135 does not react with the plasma. Therefore, the source electrode SE and the drain electrode DE may be self-aligned not to overlap with the etch stopper 135. Therefore, a misalignment between the channel region and the source and drain electrodes SE and DE may be effectively prevented or reduced.

A portion of the first active pattern 126 that overlaps with the etch stopper 135 may serve as a channel region of the TFT. That is, the first active pattern 126 may include the first oxide semiconductor that includes indium content lower than the second oxide semiconductor of the second active pattern 127 or includes oxygen content higher than the second oxide semiconductor of the second active pattern 127, so that the channel region may have a predetermined conductivity.

According to exemplary embodiments, the source electrode SE and the drain electrode DE may be provided without performing an additional patterning process using an additional exposure mask.

Embodiments of the invention may be used for a display device such as a liquid crystal display device or an organic light emitting device ("OLED").

The foregoing is illustrative of the exemplary embodiments and is not to be construed as limiting thereof. Although a few exemplary embodiments have been described, those skilled in the art will readily appreciate from the foregoing that many modifications are possible in the exemplary embodiments without materially departing from the novel teachings and advantages of the invention. Accordingly, all such modifications are intended to be included within the scope of the exemplary embodiments. In the claims, means-plus-function clauses are intended to cover the structures described herein as performing the recited function and not only structural equivalents but also functionally equivalent structures.

What is claimed is:

1. A method of manufacturing a display substrate, the method comprising:
    forming a gate electrode on a base substrate;
    forming an oxide semiconductor layer on the gate electrode;
    forming an insulation layer on the oxide semiconductor layer;
    forming a first photoresist pattern on the insulation layer;
    partially removing the insulation layer and the oxide semiconductor layer using the first photoresist pattern as an etching mask to form an active pattern;
    forming a protective pattern which partially covers the active pattern, from the insulation layer; and
    performing a plasma treatment process to promote a reduction reaction to portions of the active pattern exposed by the protective pattern, thereby forming a source electrode and a drain electrode.

2. The method of claim 1, wherein the source electrode and the drain electrode are exposed by the protective pattern.

3. The method of claim 1, wherein the plasma treatment process is performed in an atmosphere including a hydrogen gas.

4. The method of claim 3, wherein the forming the source electrode and the drain electrode comprises reducing indium from the oxide semiconductor of the active pattern.

5. The method of claim 1, wherein the plasma treatment process is performed in an atmosphere including a fluorine gas.

6. The method of claim 5, wherein the forming the source electrode and the drain electrode comprises implanting fluorine at upper portions of the active pattern.

7. The method of claim 1, wherein the first photoresist pattern includes a first thickness portion and a second thickness portion, and wherein the second thickness portion is thinner than the first thickness portion.

8. The method of claim 7, wherein the forming the first photoresist pattern comprises using a slit mask.

9. The method of claim 7, wherein the forming the first photoresist pattern comprises using a half-tone mask.

10. The method of claim 1, wherein the forming the protective pattern comprises:
    exposing the first photoresist pattern from a back side of the base substrate using the gate electrode as an exposure mask;
    partially removing the first photoresist pattern to provide a remaining photoresist pattern; and
    partially removing the insulation layer using the remaining photoresist pattern as the etching mask.

11. The method of claim 1, wherein the forming the oxide semiconductor layer comprises:
    forming a first oxide semiconductor layer including a first oxide semiconductor, the first oxide semiconductor layer overlapping with the gate electrode; and
    forming a second oxide semiconductor layer including a second oxide semiconductor on the first oxide semiconductor layer.

12. The method of claim 11, wherein the second oxide semiconductor includes an indium content higher than that of the first oxide semiconductor.

13. The method of claim 12, wherein the forming the source electrode and the drain electrode comprises performing the plasma treatment process to promote the reduction reaction to portions of the second active pattern.

\* \* \* \* \*